United States Patent [19]

Fensch et al.

[11] Patent Number: 5,461,583

[45] Date of Patent: Oct. 24, 1995

[54] PROGRAMMABLE FREQUENCY SINE WAVE SIGNAL GENERATOR

[75] Inventors: Thierry Fensch; Yves Mazoyer, both of Grenoble, France

[73] Assignee: SGS-Thomson Microelectronics S.A., Pouilly, France

[21] Appl. No.: 212,222

[22] Filed: Mar. 14, 1994

[30] Foreign Application Priority Data

Mar. 17, 1993 [FR] France .................... 93 03329

[51] Int. Cl.$^6$ ................ G06G 7/16; G06J 1/00
[52] U.S. Cl. ........................... 364/851; 364/607
[58] Field of Search ................ 364/718, 721, 364/851, 607; 328/14

[56] References Cited

U.S. PATENT DOCUMENTS

| | | | |
|---|---|---|---|
| 3,568,069 | 3/1971 | Gabor | 328/14 |
| 4,267,761 | 5/1981 | Deutsch | 364/721 |
| 4,422,155 | 12/1983 | Amir et al. | 364/606 |
| 4,630,217 | 12/1986 | Smith et al. | 328/14 |
| 4,631,694 | 12/1986 | Single | 364/608 |
| 4,713,622 | 12/1987 | Wanchoo et al. | 328/14 |
| 5,095,279 | 3/1992 | Quan et al. | 328/14 |
| 5,121,069 | 6/1992 | Burns et al. | 328/14 |

OTHER PUBLICATIONS

Electronics Letters, vol. 22, No. 12, 1986, Stevenage GB, pp. 635–636, "Sine–Wave Generation Using A High–Order Lowpass Switched Capacitor Filter".

Primary Examiner—Tan V. Mai
Attorney, Agent, or Firm—Greenfield & Sacks

[57] ABSTRACT

A programmable frequency sine wave signal generator, including a generator for generating square-wave signals having a programmable frequency; a counter for counting the periods of the square-wave signals; circuits for providing successive discrete sine wave values from successive states of the counter; and a low-pass filter receiving the successive discrete sine wave values and providing the sine wave. The low-pass filter is a switched-capacitor filter with a switching mode that is controlled by a signal having a frequency proportional to the frequency of the square-wave signal. Correct selection of the values of the filter capacitors allows the cut-off frequency of the filter to be continuously substantially the same as the frequency of the sine wave.

32 Claims, 3 Drawing Sheets

PROGRAMMABLE FREQUENCY SINE WAVE SIGNAL GENERATOR

BACKGROUND OF THE INVENTION

1. Field of the Invention

The present invention relates to synthesizers generating sine wave signals at a programmable frequency, intended, for example, to produce tones by means of successive programming operations of the frequency signal, or to provide superposed sine waves having distinct frequencies by simultaneously programming several generators and then summing outputs of the generators.

2. Discussion of the Related Art

Programmable sine wave signal generators are often used in telephone systems to generate ring tones or Dual Tone Modulation Frequency (DTMF) signals that result from the superposition of two distinct, but substantially similar, sine wave frequencies.

FIG. 1 schematically represents a programmable sine wave signal generator used in conventional telephone sets. This generator includes an adder 10 for adding an 8-bit programmarion word A and a 12-bit return word B. The output of adder 10 is provided at the input of a D-type flip-flop 12, which is clocked by a clock signal F. The return word B is provided by the output of flip-flop 12.

With such a configuration, the four most significant bits (B8–B11) of word B oscillate at frequencies that are proportional to the value of word A and at the frequency of the clock signal F. In addition, the states of bits B8–B11 vary so as to carry out a binary counting. Thus, adder 10 and flip-flop 12 form a 4-bit counter having a programmable counting frequency or a generator 13 for generating a programmable frequency square-wave signal (the output of generator 13 can be any one of bits B8–B11).

Bits B8–B11 form a word B(11:8) provided to a decoder 4 that selects a corresponding value in a Read Only Memory (ROM) 15 (with 4 bits, in the given example, 16 distinct values can be selected). The output of ROM 15 (the selected value) is provided to the input of a digital-analog converter (DAC) 17 whose output S, filtered by a low-pass filter 19, provides the sine wave signal to be generated.

FIG. 1B shows the waveform of signal S generated by the circuit of FIG. 1A. Signal S has a discrete value for each value of word B(11:8), these discrete values having been suitably chosen so as to correspond to successive values of a sine wave period.

To save memory space, only values corresponding to one-fourth of the sine wave period are stored in ROM, the first four values in the given example. Decoder 14 is provided, using the first three bits B8–B10 of word B(11:8), to select these first four values successively by increasing order, then by decreasing order while word B(11:8) is incremented. The last bit B11 of word B(11:8) is provided to converter 17 in order to invert the polarity of signal S while the digital values, corresponding to each second sine wave half-period, are provided.

Signal S has 16 discrete values per period, and a frequency equal to the frequency of signal B11. Such a signal S generates harmonics that must be eliminated by filter 19. However, the cut-off frequency of filter 19 is fixed; therefore, this frequency must be chosen equal to the highest frequency to be generated. Thus, when frequencies that are low with respect to the cut-off frequency are generated, a large number of harmonics are not attenuated, which causes an unpleasant hiss. It is not possible with such a generator to control a piezoelectric loudspeaker, because a piezoelectric loudspeaker tends to enter into resonance with harmonics and therefore accentuating these harmonics. The ability to control piezo-electric loudspeakers is important because they are particularly inexpensive.

Of course, if it is desired to decrease the number of harmonics that are generated at a low frequency, the number of discrete values provided at each sine wave period can be increased. However, this requires that the size of adder 10 and ROM 15 be increased, which is an expensive solution if low-frequency harmonics have to be significantly attenuated.

Additionally, filter 19 is not integrable because it requires one or several high-value capacitors that are too physically cumbersome to be integrated.

SUMMARY OF THE INVENTION

An object of the invention is to provide a programmable sine wave signal synthesizer that generates a signal having a small number of harmonics, independent of its frequency.

Another object of the invention is to provide a synthesizer that offers a more satisfactory surface/performance trade-off than conventional generators.

Another object of the invention is to fabricate a fully integrable synthesizer.

Another object of the invention is to fabricate a synthesizer that can be used with an inexpensive loud-speaker without generating unpleasant hiss.

These objects are achieved with a programmable sine wave signal generator including a generator for generating square-wave signals having a programmable frequency; means for counting periods of the square-wave signals; a decoding circuit for providing successive discrete sine wave values from successive states of the counting means; and a low-pass filter receiving the successive discrete sine wave values and providing one sine wave. According to the invention, the low-pass filter is a switched-capacitor filter with a switching mode that is controlled by a signal having a frequency proportional to the frequency of the square-wave signal. According to the invention, correct selection of the values of the filter capacitors allows the cut-off frequency of the filter to be continuously substantially the same as the sine wave frequency.

According to an embodiment of the invention, the filter receives a constant input voltage. The decoding circuit includes a switched capacitor having a programmable value to set the filter gain. The programmable capacitor is formed by a plurality of capacitors, each of which is switched on or off by a switch controlled by a decoder decoding the state of the counting means.

According to an embodiment of the invention, the counting means includes a multi-bit counter receiving at its input a square-wave signal, the most significant bit serving to control the inversion or non-inversion state of the polarity of the filter gain and the remaining bits being provided to the decoder.

According to an embodiment of the invention, the programmable switched capacitor is contained in a switch cell. One of the terminals of the programmable switched cell can be connected, through a switch controlled by the most significant bit, to switches that put the cell in a non-inversion mode or to switches that put the cell in an inversion mode.

According to an embodiment of the invention, the synthesizer produces a plurality of superposed sine waves having substantially similar programmable frequencies. The synthesizer includes a switched-capacitor filter that provides the superposed sine waves and is controlled at a frequency that is proportional to the highest of the programmable frequencies. The generator includes, for each sine wave, a generator for generating square-wave signals, counting means, decoding means, and a switched capacitor that is programmable through the decoding means.

The foregoing and other objects, features, aspects and advantages of the invention will become apparent from the following detailed description of the present invention when taken in conjunction with the accompanying drawings.

BRIEF DESCRIPTION OF DRAWINGS

In the figures, same elements are labelled with same reference characters.

DETAILED DESCRIPTION

Figure 2:
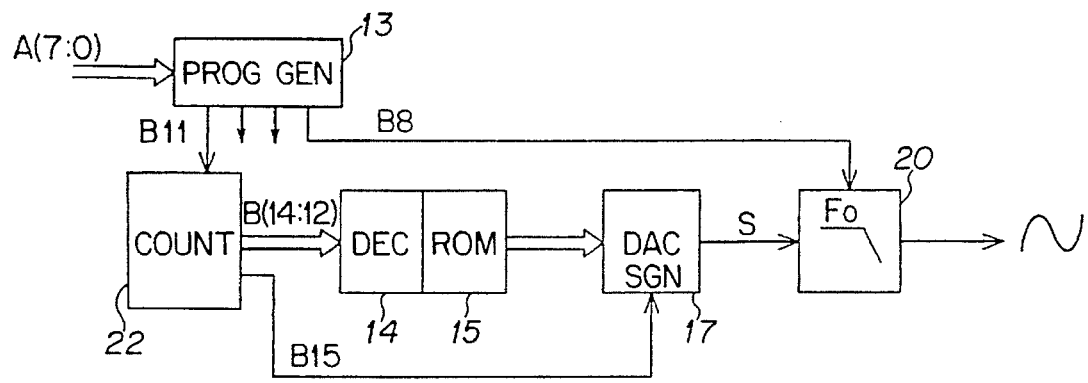
FIG. 2 represents a schematic embodiment of a programmable sine wave generator according to the invention.

FIG. 2 shows again generator 13 generating square-wave signals at a programmable frequency, decoder 14 associated with ROM 15, and the DAC 17.

According to the invention, the output signal S of DAC 17 is filtered by a switched-capacitor filter 20 with a control frequency, or sampling frequency, that is proportional to the frequency of the sine wave signal to be generated. Thus, the cut-off frequency $F_0$ of the switched-capacitor filter 20 is proportional to the frequency of the sine wave signal. The components of filter 20 are selected so that the cut-off frequency $F_0$ is slightly higher than the frequency of the sine wave signal.

A signal provided by the programmable generator 13 is used as the control signal of filter 20. In order that filter 20 operates correctly, the frequency of its control signal must be high with respect to the frequency of signal S to be filtered, the frequency of signal S being substantially equal to the cut-off frequency $F_0$. To achieve this purpose, signal B8, which has the highest frequency, is chosen as a control signal from among signals B8–B11 provided by generator 13. In addition, instead of providing the outputs of the programmable generator 13 directly to decoder 14, the output signal B11, which has the lowest frequency, is provided to a counter 22. Counter 22 provides values to decoder 14 at a frequency sufficiently low with respect to the control frequency of filter 20. In the given example, with a 4-bit (B12–B15) counter 22, a sufficient ratio (128) is obtained between the frequency of the control signal B8 and the frequency of signal B15, which is the frequency of the generated signal.

Figure 1A:
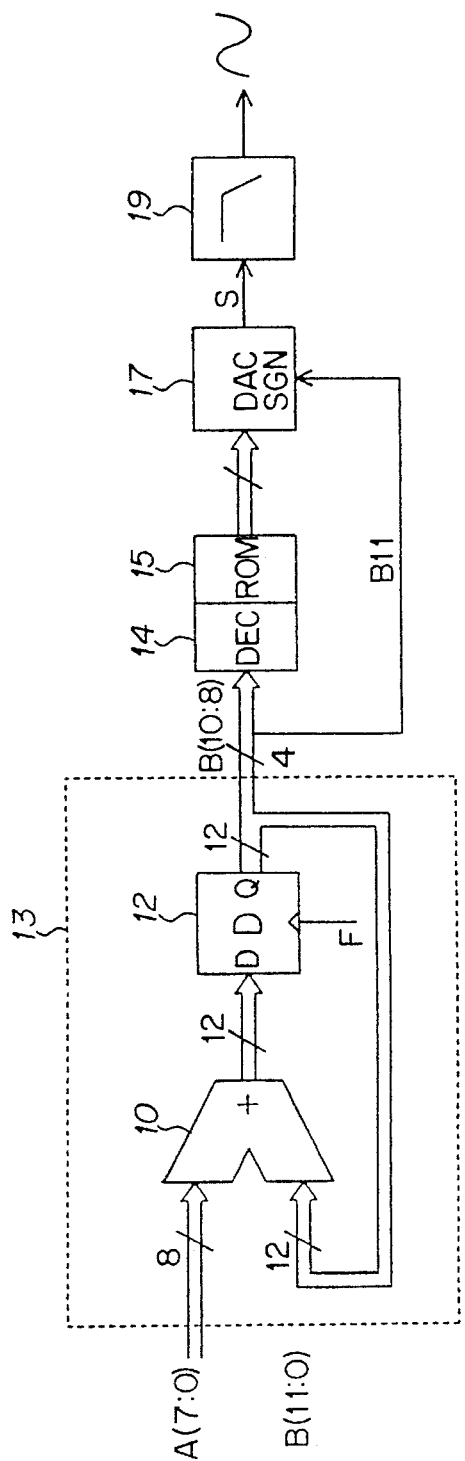
FIG. 1A, above described, represents a conventional programmable sine wave generator.
Figure 1B:
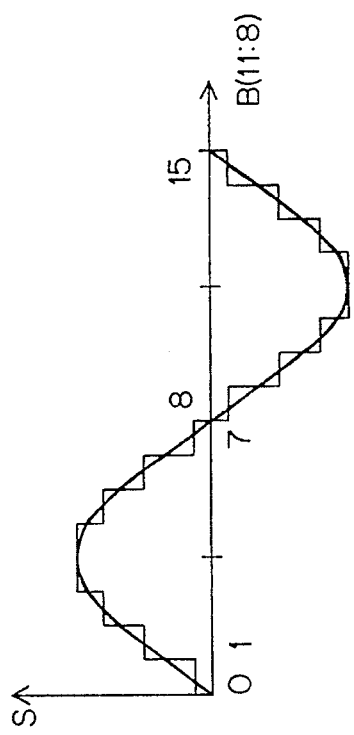
FIG. 1B represents an exemplary waveform of a sine wave signal generated before being filtered by the generator of FIG. 1A.

Signals B12–B15 play the same role as signals B8–B11, respectively, of the circuit of FIG. 1A. In the described example, a signal S is obtained, which before filtering has the waveform shown in FIG. 1B and the frequency of signal B15.

Since the cut-off frequency of filter 20 is continuously substantially similar to the frequency of signal S to be filtered, the harmonics of signal S are significantly attenuated. This attenuation becomes more significant as the order of filter 20 becomes higher. By selecting a second order filter and 16 values within a sine wave period, satisfactory results are obtained.

The sine wave signal so generated can directly feed an inexpensive loud-speaker (for example, of the piezoelectric type) without the risk that the loud-speaker may enter into resonance with harmonics, therefore generating unpleasant hiss.

In addition, the use according to the invention of a switched-capacitor filter permits the programmable generator according to the invention to be fully integrable, because the filter capacitors can be chosen with very low values (only the capacitor ratios are taken into account in switched-capacitor filters).

Figure 3:
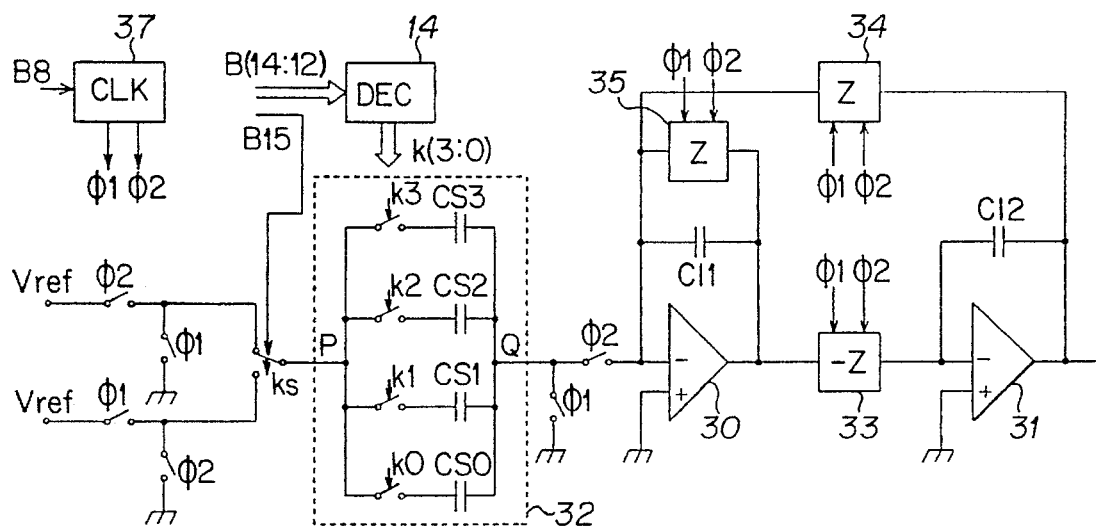
FIG. 3 represents in more detail an alternative embodiment of the programmable sine wave generator according to the invention.

FIG. 3 schematically represents an alternative embodiment of a programmable sine wave generator according to the invention, in which the switched-capacitor filter 20 is represented in more detail. Such an embodiment advantageously allows for the elimination of ROM 15 and DAC 17, which renders the generator according to the invention particularly inexpensive.

The switched-capacitor filter is a second order filter including a filtering part which has two operational amplifiers 30 and 31 and, according to an aspect of the invention, a gain adjustment part 32 including a capacitor network CS0–CS3, referred to as gain capacitors, that can be switched on or off by respective switches k0–k3. The filter input receives a constant reference voltage Vref. The discrete values of the sine wave to be generated are obtained by decoder 14 that, through switches k0–k3, selects corresponding gains of the filter. These aspects are described in more detail below.

The operational amplifiers 30 and 31 are connected as inverters. An integration capacitor CI1 connects the output of amplifier 30 to its own input, and an integration capacitor CI2 connects the output of amplifier 31 to its own input. The output of amplifier 31 provides the generated sine wave signal. The output of amplifier 30 is coupled to the input of amplifier 31 through an inverting switched-capacitor cell (–Z) 33. The output of amplifier 31 is coupled to the input of amplifier 30 through a non-inverting switched-capacitor cell (Z) 34. A non-inverting switched-capacitor cell 35 is connected in parallel with the integration capacitor CI1.

Each cell 33–35 is controlled by two clock signals, $\phi1$ and $\phi2$, respectively. Clock signals $\phi1$ and $\phi2$ are provided by a clock generator 37 from signal B8 which is provided by the programmable generator 13. As is known in the technique, signals $\phi1$ and $\phi2$ have a frequency that is equal to the frequency of signal B8 but have non-overlapping active levels to switch switches in phase opposition so that these switches are not simultaneously on. Hereinafter, a switch controlled by a signal $\phi1$ or $\phi2$ is referred to as a switch $\phi1$ or $\phi2$, respectively.

The gain adjustment part 32 of the filter includes gain capacitors CS0–CS3, each of which can be set in series between an input node P and an output node Q through a respective switch k0–k3. Switches k0–k3 are controlled by a decoder 14, as described hereinafter. Node Q is connected to the input of amplifier 30 through a switch 92 and to a reference voltage, for example, a zero voltage, through a switch φ1. Node P can connected to the reference voltage Vref through either of the two branches depending on the position of a switch kS. The first branch (the branch corresponding to the shown position of switch kS) connects node P to the reference voltage Vref through a switch φ2 and to a zero voltage through a switch φ1. The second branch connects node P to the reference voltage Vref through a switch φ1 and to a zero voltage through a switch φ2.

When the first branch is selected, a non-inverting switched-capacitor cell is provided between the reference voltage Vref and the input of amplifier 30, the switched capacitor being one or several gain capacitors selected by switches k0–k3. When the second branch is selected, this cell becomes an inverting cell. Thus, the position of switch kS determines the polarity of the output signal of the filter. Switch kS is controlled by signal B15. The filter gain is equal to the ratio between the capacitor value of cell 34 and the value of the selected gain capacitor. Thus, each discrete sine wave value is generated by selecting one or several gain capacitors, being assumed that the values of the gain capacitors were correctly chosen during manufacturing. The selection of the gain capacitors can be made in two ways that determine the various values to be chosen for the capacitors. In the first method, only one of the capacitors can be selected at a time; in the second method, a first capacitor can be initially selected, the other capacitors being set in parallel with the first one.

FIG. 3 shows four gain capacitors CS0–CS3, which provide four discrete values for a sine wave half-period and therefore sixteen discrete values for a sine wave period. Decoder 14 is connected, using the three signals B12–B14 for example, in order to successively select the gain capacitors from CS0 to CS3, then from CS3 to CS0, with switch kS being switched after each of these cycles by signal B15.

Figure 4A:
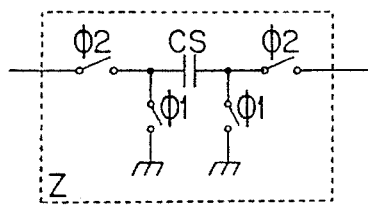
FIGS. 4A and 4B represent in more detail two components of the generator of FIG. 3.
Figure 4B:
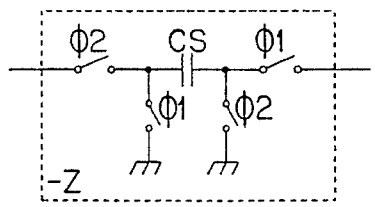

FIGS. 4A and 4B represent a non-inverting switched-capacitor cell Z and an inverting switched-capacitor cell –Z, respectively.

In FIG. 4A, each terminal of a capacitor CS is grounded through a switch φ1 and connected to the output or to the input of the cell through a switch φ2.

In FIG. 4B, the positions of the switches associated with one of the terminals of a capacitor CS are inverted with respect to those of FIG. 4A.

All the components of FIG. 3 can be integrated and thus occupy a small silicon surface relative to the surface required by a generator using a ROM and a DAC.

The invention also relates to the generation of differential sine wave signals. To achieve this purpose, operational amplifiers 30, 31 with differential outputs are used; the components described with reference to FIG. 3 are duplicated for each differential path.

Figure 5:
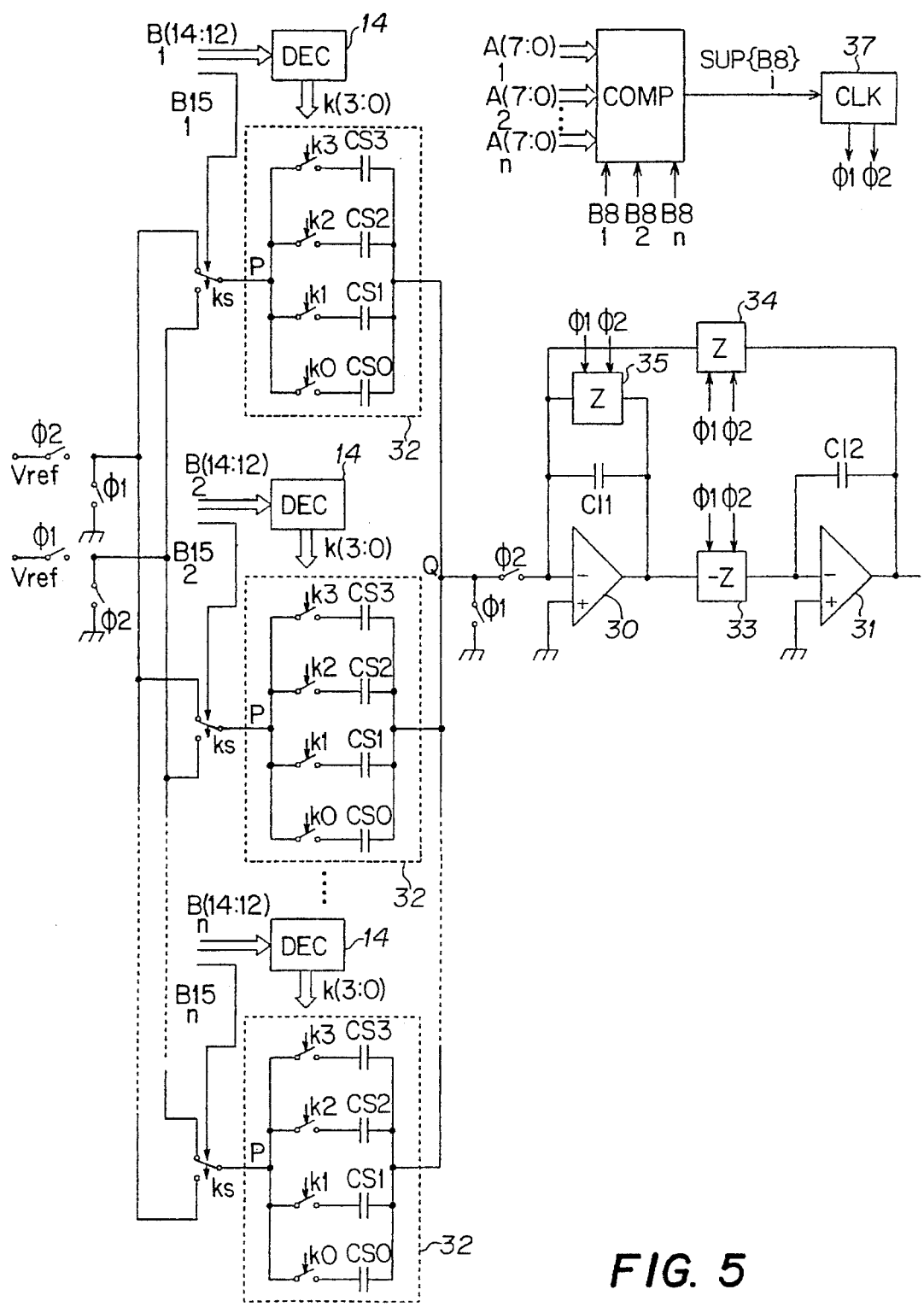
FIG. 5 represents an embodiment of a generator according to the invention for generating a plurality of superposed sine waves having distinct programmable frequencies.

FIG. 5 represents an implementation of a generator for generating several superposed sine waves having distinct programmable frequencies. The generator includes, instead of switch kS and the gain adjustment part 32 of FIG. 3, a plurality of switches kS and gain adjustment parts 32, disposed in parallel. With each gain adjustment part 32 is associated a decoder 14 and a counter (not shown) providing bits $B_i12$–$B_i14$ to the decoder, and a bit $B_i^{15}$ (i=1, 2. . . n) to switch kS. Of course, each counter is associated with a programmable generator 13 (not shown) providing bits $B_i8$–$B_i11$ with a switching frequency that is set by a program word $A_i(7:0)$.

With this configuration, the single filtering part receives a series of steps corresponding to several superposed digitized sine waves.

As is shown in FIG. 5, the clock circuit 37 that serves clock switches φ1 and φ2 is controlled by the highest frequency signal among signals $B_18$, $B_28$ . . . $B_n8$; this signal, labelled Sup{$B_i8$}, is provided by a circuit 38.

Circuit 38 receives each program word $A_i(7:0)$ and each signal $B_i8$. Circuit 38 determines the most significant word among words $A_i(7:0)$ and routes to its output the corresponding signal $B_i8$.

With such a system, the cut-off frequency of the switched-capacitor filter is set to the highest of the generated sine wave frequency. Thus, the lower sine wave frequencies have a higher distortion than the sine waves having a higher frequency. However, if the extreme frequency ratio does not exceed approximately 1.5, distortion remains within tolerable levels.

Such a circuit is particularly suitable, in a telephone set, for generating Dual Tone Modulation Frequency (DTMF) signals that are formed by superposition of two sine waves having substantially identical frequencies.

Further relevant details on the fabrication of switched-capacitor filters, more particularly on the choice of the capacitor values to set the cut-off frequency of the filter, can be found in "Design of MOS VLSI Circuit for Telecommunications" by Tsividis-Antognettis, Editions Prentice-Hall, England.

As is apparent to those skilled in the art, various modifications can be made to the above disclosed preferred embodiments, in particular regarding the choice of the switched-capacitor filter and the number of gain adjustment capacitors as well as their control mode. The gain adjustment capacitors can be differently arranged; they can, for example, be disposed in series with their respective switch disposed in parallel.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended to be limiting. The invention is limited only as defined in the following claims and the equivalents thereto.

What is claimed is:

1. A programmable frequency sine wave signal generator including:

at least one generator for generating square-wave signals having a programmable frequency;

at least one means for counting the periods of said square-wave signals;

at least one decoding means for providing successive discrete sine wave values from successive states of said at least one counting means;

a low-pass filter receiving the successive discrete sine wave values and providing at least one of said sine waves;

wherein said low-pass filter is a switched-capacitor filter whose switching mode is controlled by a signal having a frequency proportional to the frequency of said square-wave signal, wherein, by adequately selecting the values of the filter capacitors, a cut-off frequency of the filter is constantly substantially similar to the frequency of said at least one sine wave.

2. The generator of claim 1 generating at least one sine wave, wherein the filter receives a constant input voltage and wherein the decoding means includes a switched capacitor having a programmable value to set a gain of the filter, said programmable switched capacitor being formed by a plurality of capacitors, each of which is switched on or off by a switch controlled by a decoder decoding the state of the counting means.

3. The generator of claim 2 generating at least one sine wave, wherein the counting means includes a multi-bit counter, receiving at an input said square-wave signal, and generating at a plurality of outputs a multi-bit signal, each of the plurality of outputs corresponding to one bit, a most significant bit of said plurality of outputs serving to control the inversion or non-inversion state of the polarity of the filter gain, and the remaining bits being provided to said decoder.

4. The generator of claim 3 generating at least one sine wave, wherein the programmable switched capacitor is contained in a switch cell having at least one terminal wherein one of the at least one terminals of the programmable switched cell can be connected, through a switch controlled by the most significant bit, to switch to turn the cell to non-inversion mode, or to switch to turn the cell to inversion mode.

5. The generator of claim 4, further adapted for generating a plurality of superposed sine waves having substantially similar programmable frequencies, including:

a switched-capacitor filter that provides the superposed sine waves and is controlled at a frequency that is proportional to the highest of said programmable frequencies;

for each sine wave, a generator for generating square-wave signals;

counting means;

decoding means; and a switched capacitor that is programmable through the decoding means.

6. A programmable frequency sine wave signal generator, comprising:

a programmable square-wave generator generating a square wave signal having a frequency and a corresponding period;

a counter counting the period of the square-wave signal;

a decoder providing a successive discrete sine wave value from a successive counter state; and a switched capacitor low-pass filter receiving the successive discrete sine wave value and the square-wave signal and producing an output sine wave in response to a switching mode signal having a switching control frequency proportional to the programmable square-wave frequency, wherein a cut-off frequency of the low-pass filter is continuously substantially the same as a frequency of the output sine wave.

7. The generator of claim 6, wherein the switched capacitor filter receives a constant input voltage and wherein the decoder includes a switched capacitor having a programmable value to set a gain of the filter, the switched capacitor being switched on or off by a first switch that is responsive to the state of the decoder.

8. The generator of claim 7, wherein the counter is a multi-bit counter receiving the square-wave signal and providing a control bit and wherein the control bit controls an inversion state of a polarity of the filter gain.

9. The generator of claim 8, further comprising:

a switch cell containing the programmable switched capacitor and a switch cell terminal; and a second switch coupled to the switched cell terminal and responsive to the control bit to switch the cell between an inversion mode and a non-inversion mode.

10. The generator of claim 9, wherein:

the generator generates a plurality of superposed sine waves having a plurality of substantially similar programmable frequencies;

the low-pass filter cut off frequency is substantially similar to the highest of said programmable frequencies;

the square-wave generator includes a plurality of square-wave generators;

the counter includes a plurality of counters;

the decoder includes a plurality of decoders; and the switched capacitor circuit includes a plurality of switched capacitor circuits.

11. A programmable frequency sine wave signal generator, comprising:

a programmable square wave generator means for generating a square-wave signal having a frequency and a corresponding period;

a counter means for counting the period of the square-wave signal;

a decoder means for providing a successive discrete sine wave value from a successive counter state; and a switched capacitor low-pass filter means for receiving the successive discrete sine wave value and the square-wave signal and producing an output sine wave in response to a switching mode signal having a switching control frequency proportional to the programmable sine wave frequency, wherein a cut-off frequency of the low-pass filter is continuously substantially the same as a frequency of the output sine wave.

12. The generator of claim 11, wherein the switched capacitor filter means receives a constant input voltage and wherein the decoder means includes a switched capacitor having a programmable value to set a gain of the filter means, the switched capacitor being switched on or off by a first switch that is responsive to the state of the decoder means.

13. The generator of claim 12, wherein the counter means is a multi-bit counter means for receiving the square-wave signal and for providing a control bit and wherein the control bit controls an inversion state of a polarity of the gain of the filter means.

14. The generator of claim 13, further comprising;

a switch cell containing the programmable switched capacitor and a switch cell terminal; and a second switch coupled to the switch cell terminal and responsive to the control bit to switch the cell between an inversion mode and a non-inversion mode.

15. The generator of claim 14, wherein:

the generator means generates a plurality of superposed sign waves having a plurality of substantially similar programmable frequencies;

the low-pass filter cut-off frequency is substantially similar to a highest of said programmable frequencies;

the square-wave generator means includes a plurality of square-wave generators;

the counter means includes a plurality of counters;

the decoder means includes a plurality of decoders; and the switched capacitor means includes a plurality of switched capacitor circuits.

16. A programmable frequency differential sine wave signal generator comprising:

a programmable square-wave generator, generating a square wave signal, having a frequency and a corresponding period;

a counter, counting the period of the square wave signal;

a decoder coupled to an output of the counter, providing a first and a second differential successive discrete sine wave value from a successive counter state; and a switched capacitor low-pass filter receiving the first and second differential successive discrete sine wave values, and the square wave signal, and producing a differential output sine wave in response to a switching mode signal, having a switching control frequency proportional to the programmable square-wave frequency, said filter having a cut-off frequency continuously substantially the same as a frequency of the output sine wave.

17. The generator of claim 16 wherein the switched capacitor filter receives a constant input voltage and wherein the decoder includes a first and a second switched capacitor, said switched capacitors, each having a programmable value to set a gain of the filter, the switched capacitors being switched on or off by a first switch that is responsive to the state of the decoder, said first switched capacitor defining the first differential successive discrete sine wave value, and the second switched capacitor defining said second differential successive discrete sine wave value.

18. The generator of claim 17, wherein the counter is a multi-bit counter receiving the square-wave signal and providing a control bit which controls an inversion state of a polarity of the gain of the filter.

19. The generator of claim 18 further comprising:

a first and second switch cell, the first switch cell containing the first switched capacitor and the second switch cell containing the second switch capacitor, each switch cell further comprising a switched cell terminal and a second switch, coupled to the switched cell terminal, responsive to the control bit to switch the cell between an inversion mode and a non-inversion mode.

20. A programmable sine wave signal generator for providing a plurality of superposed sine waves having different frequencies comprising:

a plurality of generators for generating a plurality of square wave signals having programmable frequencies;

a plurality of counters, each counting a period of one of the plurality of square wave signals;

a plurality of decoders, each responsive to one of the plurality of counters, providing a plurality of successive discrete sine wave values from a successive counter state; and a switched capacitor low pass filter receiving the plurality of successive discrete sine wave values and the plurality of square wave signals and producing a plurality of superposed output sine waves in response to a switching mode signal having a switching control frequency proportional to the highest of said programmable frequency, said low pass filter having a cut off frequency continuously substantially the same as the highest of said different frequencies of said superposed sine waves.

21. The signal generator of claim 20 wherein the switched capacitor filter receives a constant input voltage, and wherein the plurality of decoders each include a switched capacitor having a programmable value to set a gain of the filter. The switched capacitor being switched on or off by a first switch that is responsive to the state of the decoder.

22. The signal generator of claim 20 wherein each of the plurality of counters is a multi-bit counter receiving one of the plurality of square wave signals, and providing a control bit which controls an inversion state of a polarity of the gain of the filter.

23. The signal generator of claim 20 wherein the plurality of generators generate a plurality of square waves having substantially a same first frequency so that the superposed output sine waves have substantially a same second frequency thereby creating dual tone modulation frequency signals.

24. A programmable tone generator system comprising:

a programmable square wave generator generating a square wave signal having a frequency and a corresponding period;

a counter counting the period of the square wave signal;

a decoder, coupled to an output of the counter, providing a successive discrete sine wave value from a successive counter state;

a switched capacitor low pass filter receiving the successive discrete sine wave value and the square wave signal and producing an output sine wave in response to a switching mode signal having a switching control frequency proportional to the programmable square wave frequency wherein a cut-off frequency of the low pass filter is continuously substantially the same as a frequency of the output sine wave; and a loud speaker connected to the filter to produce audible tones.

25. The generator of claim 24 wherein the switched capacitor filter receives a constant input voltage, and wherein the decoder includes a switched capacitor having a programmable value to set a gain of the filter, the switched capacitor being switched on or off by a first switch that is responsive to the state of the decoder.

26. The generator of claim 24 wherein the counter is a multi-bit counter receiving the square wave signal and providing a control bit and wherein the control bit controls an inversion state of a polarity of the filter gain.

27. The generator of claim 26 further comprising a switch cell containing the programmable switched capacitor in a switch cell terminal and a second switch coupled to the switched cell terminal and responsive to the control bit to switch the cell between an inversion mode and non-inversion mode.

28. The generator of claim 27 wherein the generator generates a plurality of superposed sine waves having a plurality of substantially similar programmable frequencies, and wherein the low pass filter cut-off frequency is proportional to at least one of the substantially similar programmable frequencies.

the square wave generator includes a plurality of square wave generators;

the counter includes a plurality of counters;

the decoder includes a plurality of decoders; and the switched capacitor circuit includes a plurality of switched capacitor circuits.

29. The generator of claim 28 wherein the loud speaker is a piezoelectric loud speaker.

30. The generator of claim 24 wherein the loud speaker is a piezoelectric loud speaker.

31. A method for generating programmable frequency sine wave signals comprising the steps of:

generating square wave signals having a programmable frequency and a corresponding period;

counting the periods of the square wave signals and outputting successive counter states;

decoding the successive counter states and producing successive discrete sine wave values;

providing a switched capacitor low pass filter which receives the successive discrete sine wave values and the square wave signal and produces output sine waves in response to a switching mode signal having a switching control frequency proportional to the programmable square wave frequency, and wherein a cut-off frequency of the low pass filter is continuously substantially the same as a highest frequency of the output sine waves.

32. The method of claim 31 including the additional steps of:

providing a constant input voltage to the switched capacitor filter;

setting the gain of the filter using a switched capacitor having a programmable value; and switching the switched capacitor on or off by a first switch that is responsive to a signal generated from the successive counter states signal.

* * * * *

UNITED STATES PATENT AND TRADEMARK OFFICE
CERTIFICATE OF CORRECTION

PATENT NO. : 5,461,583
DATED : October 24, 1995
INVENTOR(S) : Thierry FENSCH and Yves MAZOYER It is certified that error appears in the above-indentified patent and that said Letters Patent is hereby corrected as shown below:

```
On title page, item

[73]          Assignee:   SGS-Thomson Microelectronics S.A.,
                         Saint-Genis, Pouilly, France
```

Signed and Sealed this

Second Day of January, 1996

Attest:

BRUCE LEHMAN

Attesting Officer

Commissioner of Patents and Trademarks